United States Patent [19]

Shipley

[11] Patent Number: 4,728,928
[45] Date of Patent: Mar. 1, 1988

[54] CALL SWITCH FOR WET AREAS

[75] Inventor: Robert T. Shipley, Oakland, Calif.

[73] Assignee: Fisher Berkeley Corporation, Emeryville, Calif.

[21] Appl. No.: 861,223

[22] Filed: May 8, 1986

[51] Int. Cl.$^4$ .............................................. G08B 25/00
[52] U.S. Cl. ...................................... 340/287; 340/547;
340/548; 340/387; 340/686; 200/61.77;
335/205; 338/32 H
[58] Field of Search ................ 340/287, 300, 546, 547,
340/548, 573, 693, 686, 387; 200/61.77, 61.62,
61.45 M, 85, 61.85; 116/DIG. 44; 335/205, 206;
338/32 H

[56] References Cited

U.S. PATENT DOCUMENTS

| 3,696,380 | 10/1972 | Murphy | 340/547 |
| 3,769,556 | 10/1973 | Feldman | 340/547 |
| 3,913,092 | 10/1975 | Klingenberg | 340/573 |
| 4,359,719 | 11/1982 | Schwarzer | 340/287 |
| 4,389,635 | 6/1983 | Gallagher | 340/287 |

Primary Examiner—Donnie L. Crosland
Attorney, Agent, or Firm—Flehr, Hohbach, Test, Albritton & Herbert

[57] ABSTRACT

Call switch for use by hospital patients and staff members to summon aid in wet areas such as shower and bath areas. An actuating magnet is positioned on the front side of a waterproof panel for controlling the operation of electronic circuitry mounted in a dry area behind the panel. The magnet is carried by a slide for movement between rest and tripped positions, and a pull cord is connected to the slide by a breakaway member which permits the cord to separate from the slide when a patient becomes entangled in the cord or the pull on the cord otherwise exceeds a predetermined limit.

15 Claims, 4 Drawing Figures

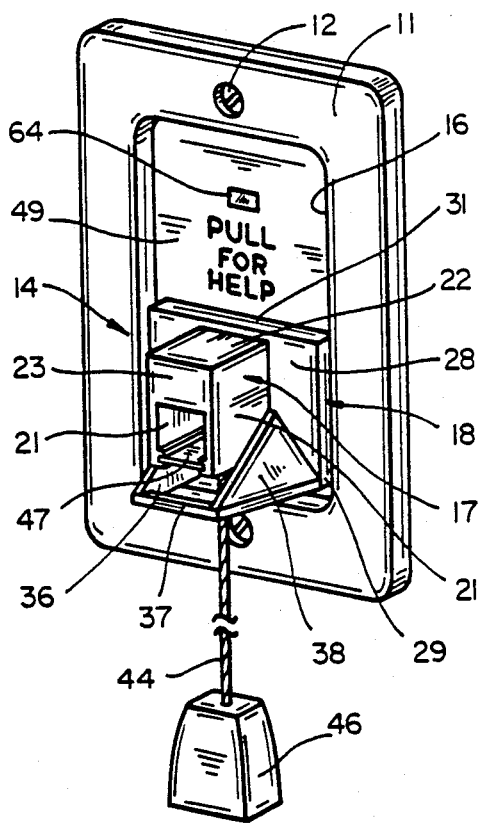
FIG_1
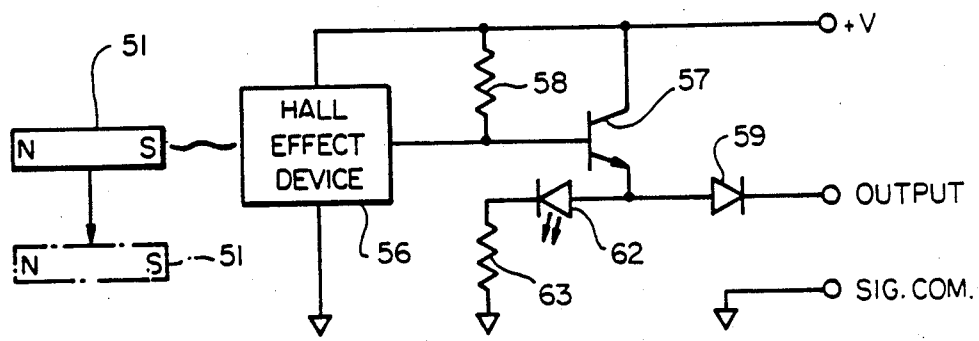
FIG_4

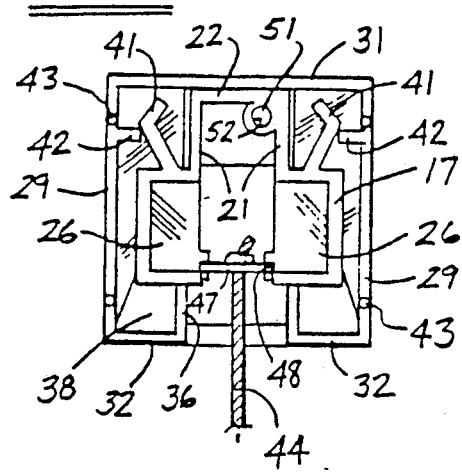
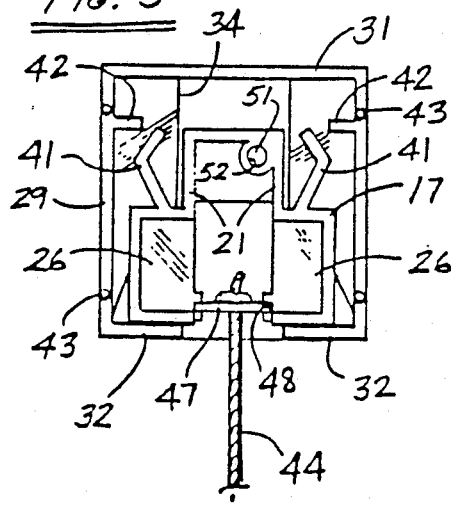

CALL SWITCH FOR WET AREAS

This invention pertains generally to calling systems for use in hospitals, and more particularly to a call switch for use in wet areas such as shower and bath areas of room or ward lavatories.

In hospital calling system, stations are positioned in patient rooms and other areas to permit patients to summon aid when they need it and to provide rapid communication between nurses and other staff members. One area in which a patient may need to summon help is a shower or bath area where conventional electric calling devices cannot be utilized because of the wetness which is present. Heretofore, call switches for showers have been located outside the shower itself, with pull cords trained about guides to permit patients to actuate the switches from within the shower. This arrangement is somewhat cumbersome to install and to use, and the guides can impair movement of the cord and actuation of the switch. Also, there is a danger of injury to a patient if he should become entangled in the cord.

It is in general an object of the invention to provide a new and improved call switch for wet areas.

Another object of the invention is to provide a call switch of the above character which can be mounted directly in the wet area.

Another object of the invention is to provide a call switch of the above character in which the risk of injury to a patient by entanglement with a pull cord is substantially eliminated.

These and other objects are achieved in accordance with the invention by providing a call switch having a panel adapted to be mounted in a wet area with the front side of the panel being exposed to the wet area and the rear side of the panel being isolated from it. A magnet is mounted on the front side of the panel for movement between first and second positions, and electronic circuit means including a magnetically controlled switching device is mounted in the dry area behind the panel for delivering an output signal when the magnet is in the second position. The magnet is carried by a slide, and a pull cord is connected to the slide by a breakaway member which permits the cord to separate from the slide when the pull on the cord exceeds a predetermined level.

FIG. 1 is an isometric view of one embodiment of a call switch according to the invention.

FIG. 2 is a rear elevational view of the slide and frame assembly in the embodiment of FIG. 1, showing the slide in the rest position.

FIG. 3 is a view similar to FIG. 2, showing the slide in the tripped position.

FIG. 4 is a circuit diagram of the call switch of FIG. 1.

The call switch has a panel or plate 11 adapted to be mounted on a standard electrical switch box (not shown) which can, for example, be mounted in the wall of a shower stall. A watertight seal is formed by a gasket (not shown) positioned between the back side of the panel and the surface of the shower wall. Thus, even though the front side of the panel is exposed to the wet area, the back side of the panel and the interior of the switch box are isolated from the wet area and kept dry. The panel is secured to the switch box by mounting screws 12.

A slide assembly 14 is mounted in a recessed area 16 on the front side of the panel. This assembly comprises a slide 17 mounted in a holder 18 for movement between a rest position and a tripped position. The slide is illustrated in the rest position in FIGS. 1 and 2 and in the tripped position in FIG. 3.

Slide 17 comprises a generally rectangular, hollow body having side walls 21, a top wall 22 and a short front wall 23. The rear and bottom sides of the slide are open, as is the lower portion of the front side. A pair of ears 26 project laterally from the rear portions of side walls 21.

Holder 18 has a planar front wall 28, side walls 29, a top wall 31, and bottom walls 32. Front wall 28 is spaced from and generally parallel to the wall of the panel at the rear of recessed area 16. A generally rectangular opening 34 is formed in wall 28, and slide 17 projects through this opening, with ears 26 retained in the area between wall 28 and the wall at the rear of recessed area 16. Top wall 22 abuts against the lower side of top wall 31 when the slide is in the rest position, and the lower edges of ears 26 abut against the upper surface of bottom walls 32 when the slide is in the tripped position.

Generally triangular side walls 36 project in an outward direction from front wall 28 along the lower portion of opening 34. These walls serve as a guide for the rectangular body of slide 17 as it moves from the rest position to the tripped position. These walls are braced by a front cross member 37 and by inclined triangular walls 38 which are connected to front wall 28 and bottom walls 32.

Means is provided for releasably holding slide 17 in the rest position. This means comprises a latch consisting of flexible arms 41 carried by the slide and stationary posts 42 which project in an inward direction from the side walls 29 of frame 18. Arms 41 are formed with knees which are normally somewhat farther apart than the spacing between the confronting ends of posts 42. The arms are connected to the slide in cantilevered fashion, with the lower ends of the arms being affixed to the upper portions of ears 26. In the rest position, the knees of arms 41 lie above posts 42, as illustrated in FIG. 2, and the arms bear against the posts to hold the top of the slide against the underside of top wall 31. When the slide is moved toward the tripped position, the arms are deflected toward each other as the knees pass posts 42. In the tripped position, the knees lie below the posts and the arms are free of the posts, as illustrated in FIG. 3.

The slide assembly is secured to panel 11 by posts or stakes 43 which project rearwardly from the side walls 29 of holder 18. These stakes pass through openings in the panel and are secured by fusion on the back side of the panel.

A pull cord 44 is connected to slide 17 for moving the slide from the rest position to the tripped position. A tassel or pull 46 is connected to the lower end of the cord, and the upper end of the cord is secured to the slide by a breakaway card 47. Card 47 comprises a generally rectangular piece of flexible material, the opposing side edge portions of which are received in inwardly facing slots 48 near the bottom edges of side walls 21. The cord passes through a central opening in the card and is knotted above the card. In normal use, the card does not flex appreciably, and it provides a substantially rigid connection between the cord and the slide. When the pull on the cord is excessive, as when a patient becomes entangled in the cord, the card flexes and the edge portions are pulled out of the slots.

Panel 11, slide 17 and holder 18 can all be fabricated of a generally rigid material which is suitable for use in a wet area. Pull 46 can be fabricated of a similar material. In one presently preferred embodiment, these parts are all fabricated of ABS plastic by a molding process. Cord 44 is fabricated of a material such as nylon which is suitable for use in a wet environment, and card 47 can be fabricated of a polycarbonate or other suitable flexible material.

A plastic membrane 49 is mounted on the front side of the wall at the rear of recessed area 16. In one presently preferred embodiment, this membrane is fabricated of a polycarbonate material, and it is adhesively bonded to the panel. The words PULL FOR HELP are imprinted upon this membrane to assist patients in using the switch.

A magnet 51 is carried by slide 17 for movement with the slide. This magnet is mounted in a circular bore 52 formed at the junction of top wall 22 and one of the side walls 21. The bore extends in a generally horizontal direction, and the magnet is oriented with its south pole facing toward the panel.

Means is provided for monitoring the position of slide 17 and delivering an output signal when the slide is in the tripped position. This means includes a magnetically controlled switching device 56 such as a Hall effect device which is mounted on a circuit board (not shown) behind panel 11. The switching device is positioned near the panel and in axial alignment with magnet 51 when slide 17 is in the rest position. The Hall effect device controls the operation of an NPN transistor 57. The collector of the transistor is connected to a voltage source +V, and a resistor 58 is connected between the base and the voltage source. The output of the circuit is taken at the emitter of the transistor, and a diode 59 is connected between the emitter and an output terminal 61. A light emitting diode (LED) 62 and a resistor 63 are also connected to the emitter. The LED is positioned behind a translucent window 64 in membrane 49 to provide a visual indication when an output signal is delivered. Components 57-63 are mounted on the circuit board with Hall effect device 56.

Operation and use of the call switch is as follows. It is assumed that the switch has been mounted on the wall of a shower and that slide 17 is in its rest position. With the slide in this position, magnet 51 is aligned with the Hall effect device, and that device holds transistor 57 in an "off" or nonconducting state. When cord 44 is pulled and slide 17 moves to the tripped position, magnet 51 moves away from the Hall effect device. Transistor 57 then begins to conduct, delivering an output signal to terminal 61 and turning on LED 62. The light from LED 62 is visible through window 64 to indicate that a call has been placed. The switch is reset manually by moving slide 17 from the tripped position to the rest position.

If the patient should become entangled in the pull cord or the pull on the cord should otherwise exceed a predetermined limit, card 47 will flex and pull out of slots 48, thereby separating the cord from the slide. Once the card has been disengaged, it can be reinstalled by passing the card and the upper portion of the string through the opening behind cross member 37 and out between the cross member and the lower portion of slide 17. The card is then slid into grooves 48 from the front side of the slide. This is most easily done with the slide in the rest position.

It is apparent from the foregoing that a new and improved call switch for use in wet areas has been provided. While only one presently preferred embodiment has been described in detail, as will be apparent to those familiar with the art, certain changes and modifications can be made without departing from the scope of the invention as defined by the following claims.

I claim:

1. In a call switch for use in a wet area: a panel adapted to be mounted in the wet area with the front side of the panel exposed to the wet area and the rear side of the panel isolated from the wet area, a magnet mounted on the front side of the panel for movement between first and second positions, and means including a magnetically controlled switch mounted behind the panel for delivering an output signal when the magnet is in the second position, the panel forming a waterproof barrier between the magnet and the magnetically controlled switch.

2. The call switch of claim 1 wherein the magnet is held by a carrier mounted on the front side of the panel for sliding movement between the first and second positions without penetration of the panel.

3. The call switch of claim 2, including latch means on the front side of the panel for releasably holding the carrier in the first position and in the second position.

4. The call switch of claim 2 including a pull cord connected to the carrier for moving the magnet from the first position to the second position when pulled.

5. The call switch of claim 4 wherein the pull cord is connected to the carrier by a breakaway member which permits the cord to separate from the carrier if the pull on the cord exceeds a predetermined limit.

6. The call switch of claim 1 wherein the magnetically controlled switch comprises a Hall effect device.

7. The call switch of claim 1 including means responsive to the switch and visible through a window in the panel for providing a visual indication when the output signal is being delivered.

8. In a call switch for use in a wet area such as a shower: a panel mounted over an opening in a wall of the wet area with the front side of the panel being exposed to the wet area, means forming a watertight seal between the panel and the wall such that the opening remains dry and isolated from the wet area, a slide mounted on the front side of the panel for movement between a rest position and a tripped position, a magnet carried by the slide, and means including a magnetically controlled switch mounted behind the panel in the opening for delivering an output signal when the slide is in the tripped position, the panel forming a waterproof barrier between the slide and the magnetically controlled switch.

9. The call switch of claim 8 including a pull cord connected to the slide for moving the slide from the rest position to the tripped position.

10. The call switch of claim 8 including latch means on the front side of the panel for releasably holding the slide in the rest position and in the tripped position.

11. The call switch of claim 8 wherein the magnetically controlled switch comprises a Hall effect device.

12. The call switch of claim 8 including a window in the panel and a light emitting diode positioned behind the window and responsive to the magnetically controlled switch for indicating when the slide is in the tripped position.

13. In a call switch for use in a wet area such as a shower: a panel mounted over an opening in a wall of the wet area with the front side of the panel being exposed to the wet area, means forming a watertight seal between the panel and the wall such that the opening remains dry and isolated from the wet area, a slide mounted on the front side of the panel for movement between a rest position and a tripped position, a magnet carried by the slide, means including a magnetically controlled switch mounted behind the panel in the opening for delivering an output signal when the slide is in the tripped position, a flexible card having peripheral edge portions which normally engage the slide, and a cord attached to the central portion of the card for moving the slide from the rest position to the tripped position when pulled, the flexibility of the card being such that the edge portions are drawn out of engagement with the slide when the pull on the cord exceeds a predetermined level.

14. The call switch of claim 13 wherein opposing edge portions of the flexible card are received in opposing slots in the slide.

15. In a call switch for use in a wet area such as a shower: a panel mounted over an opening in a wall of the wet area with the front side of the panel being exposed to the wet area, means forming a watertight seal between the panel and the wall such that the opening remains dry and isolated from the wet area, a slide mounted on the front side of the panel for movement between a rest position and a tripped position, a magnet carried by the slide, means including a magnetically controlled switch mounted behind the panel in the opening for delivering an output signal when the slide is in the tripped position, a pair of stationary posts attached to the plate, and a pair of flexible arms carried by the slide and engagable with the posts to releasably hold the slide in the rest position.

* * * * *